United States Patent
Lee

(10) Patent No.: US 8,889,551 B2
(45) Date of Patent: Nov. 18, 2014

(54) DEPOSITING DEVICE AND METHOD FOR MANUFACTURING ORGANIC LIGHT EMITTING DIODE DISPLAY USING THE SAME

(75) Inventor: Sang-Woo Lee, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 85 days.

(21) Appl. No.: 13/615,275

(22) Filed: Sep. 13, 2012

(65) Prior Publication Data

US 2013/0217158 A1    Aug. 22, 2013

(30) Foreign Application Priority Data

Feb. 21, 2012    (KR) .................. 10-2012-0017419

(51) Int. Cl.
*H01L 21/44*    (2006.01)
*H01L 21/02*    (2006.01)
*C23C 16/44*    (2006.01)

(52) U.S. Cl.
CPC .......... *H01L 21/02271* (2013.01); *C23C 16/44* (2013.01)
USPC ........... 438/680; 438/758; 438/771; 438/780; 427/585; 427/255.28; 118/680; 118/681; 118/715

(58) Field of Classification Search
CPC .... B05B 12/122; B05B 13/0452; B05B 5/04; B05B 5/0403; B65B 51/026; C23C 16/4412; C23C 16/455; H01L 21/28556; H01L 21/02274; H01L 21/02238
USPC .......... 438/680, 681, 758, 771, 780; 427/585, 427/255.28, 255.26; 118/680, 681, 627, 118/715, 723 VE
See application file for complete search history.

(56) References Cited

U.S. PATENT DOCUMENTS

| | | | |
|---|---|---|---|
| 8,632,635 B2* | 1/2014 | Lee et al. | 118/726 |
| 2014/0008212 A1* | 1/2014 | Yamamoto | 204/192.1 |

FOREIGN PATENT DOCUMENTS

| | | |
|---|---|---|
| JP | 2007-227359 | 9/2007 |
| KR | 10-2007-0054871 A | 5/2007 |
| KR | 10-2009-0093161 | 9/2009 |
| KR | 10-2010-0119368 A | 11/2010 |

* cited by examiner

Primary Examiner — Hsien Ming Lee
(74) Attorney, Agent, or Firm — Christie, Parker & Hale, LLP

(57) ABSTRACT

A deposition device includes a deposition source for discharging a deposition material to be deposited on a substrate, an angle control member at least partly in a discharging path of the deposition material for controlling a discharging angle of the deposition material, and an angle control member driver coupled to the angle control member, the angle control member driver for moving the angle control member in a discharging direction of the deposition material to control the discharging angle.

11 Claims, 8 Drawing Sheets

DEPOSITING DEVICE AND METHOD FOR MANUFACTURING ORGANIC LIGHT EMITTING DIODE DISPLAY USING THE SAME

CROSS-REFERENCE TO RELATED APPLICATION

This application claims priority to and the benefit of Korean Patent Application No. 10-2012-0017419 filed in the Korean Intellectual Property Office on Feb. 21, 2012, the entire contents of which are incorporated herein by reference.

BACKGROUND (a) Field

Embodiments of the present invention relate to a deposition device and a method for manufacturing an organic light emitting diode (OLED) display using the same.

(b) Description of the Related Art

An organic light emitting diode (OLED) display includes a hole injection electrode, an electron injection electrode, and an organic emission layer formed therebetween. The OLED display emits light as holes injected from an anode and electrons injected from a cathode are recombined at the organic light emission layer. The OLED display device, having high quality properties such as low power consumption, high luminance, a wide viewing angle, a high reaction speed, and the like, is receiving much attention as a next-generation display device for mobile electronic devices.

The OLED display includes an organic light emitting display panel including a display substrate on which thin film transistors and organic light emitting diodes (OLEDs) are formed. The organic light emitting diode includes an anode, a cathode, and an organic emission layer. Holes and electrons are injected from the anode and the cathode, respectively, to form excitons, and the excitons make a transition to a ground state, thereby causing the organic light emitting diode to emit light.

In the flat panel display such as the OLED display, an organic material or metal used as the electrode may be deposited using a vacuum deposition method for depositing the material in a vacuum atmosphere and for forming a thin film on a flat plate. The vacuum deposition method positions a substrate on which an organic thin film will be formed in a vacuum chamber, and evaporates or sublimates an organic material using a deposition source unit to deposit the organic material on the substrate.

In the organic thin film deposition device used for the vacuum deposition method, uniformity of the organic thin film formed on the substrate is reduced, thereby generating a shadow on the substrate, thereby causing a reduction in uniformity of luminance in the pixel when the organic thin film emits light. Further, after the process is performed for a long time, a deposition material sprayed from the deposition source is deposited on, or causes buildup on, the entire surface of a spray nozzle, resulting in a spray angle of the material to become reduced with time, and the actual deposited amount to be reduced. In this case, thickness of the deposited thin film is reduced, and an initial design form of a correction plate is also changed to break uniformity of the film thickness.

The above information disclosed in this Background section is only for enhancement of understanding of the background of the invention, and may therefore contain information that does not form the prior art that is already known in this country to a person of ordinary skill in the art.

SUMMARY

Embodiments of the present invention provide a deposition device for forming a uniform thin film thickness by controlling a deposition angle, and a method for manufacturing an OLED display.

Embodiments of the present invention provide a deposition device for forming a uniform thin film by controlling a deposition angle that may be varied as a process time is increased, and a method for manufacturing an OLED display.

An exemplary embodiment of the present invention provides a deposition device including a deposition source for discharging a deposition material to be deposited on a substrate, an angle control member at least partly in a discharging path of the deposition material for controlling a discharging angle of the deposition material, and an angle control member driver coupled to the angle control member, the angle control member driver for moving the angle control member in a discharging direction of the deposition material to control the discharging angle.

The deposition source may include a spray nozzle for discharging the deposition material, and the angle control member may include a pair of angle control members each located on a long side of the deposition source and extending in a length direction of the deposition source.

The deposition device may further include a pair of cover plates each on a side of a respective one of the pair of angle control members, and the pair of cover plates may be configured to move in a direction crossing the discharging direction to control a gap between the pair of cover plates.

A movement of the cover plate may correspond to a movement of the angle control member.

The pair of cover plates may include at least two pairs of cover plates adjacent one another in the length direction of the deposition source.

Each of the cover plates of the at least two pairs of cover plates may be independently operable.

The angle control member driver may include a ball screw drive, a cylinder drive, or a linear motion guide drive.

The deposition device may further include a controller for controlling the angle control member driver to move the angle control member according to a process condition.

Another embodiment of the present invention provides a method for manufacturing an organic light emitting diode display, the method including facing a substrate toward a deposition source for discharging a deposition material, and forming a thin film on the substrate by discharging the deposition material on the substrate, wherein the forming of the thin film on the substrate includes controlling a discharging angle of the deposition material by moving an angle control member with respect to the deposition source, the angle control member being partly in the discharging path of the deposition material.

Moving the angle control member may include moving the angle control member toward the deposition source at a rate corresponding to an amount of process time passed.

The deposition material may include an organic material for forming an organic emission layer, and the thin film may include the organic emission layer.

According to the exemplary embodiments of the present invention, a substantially uniform thin film thickness may be formed. Further, the uniform thin film can be formed by correcting the deposition angle when it is changed when the process time is increased.

Also, the uniform organic thin film can be deposited over the pixel to increase luminance uniformity of respective pixels.

DETAILED DESCRIPTION

Figure 1:
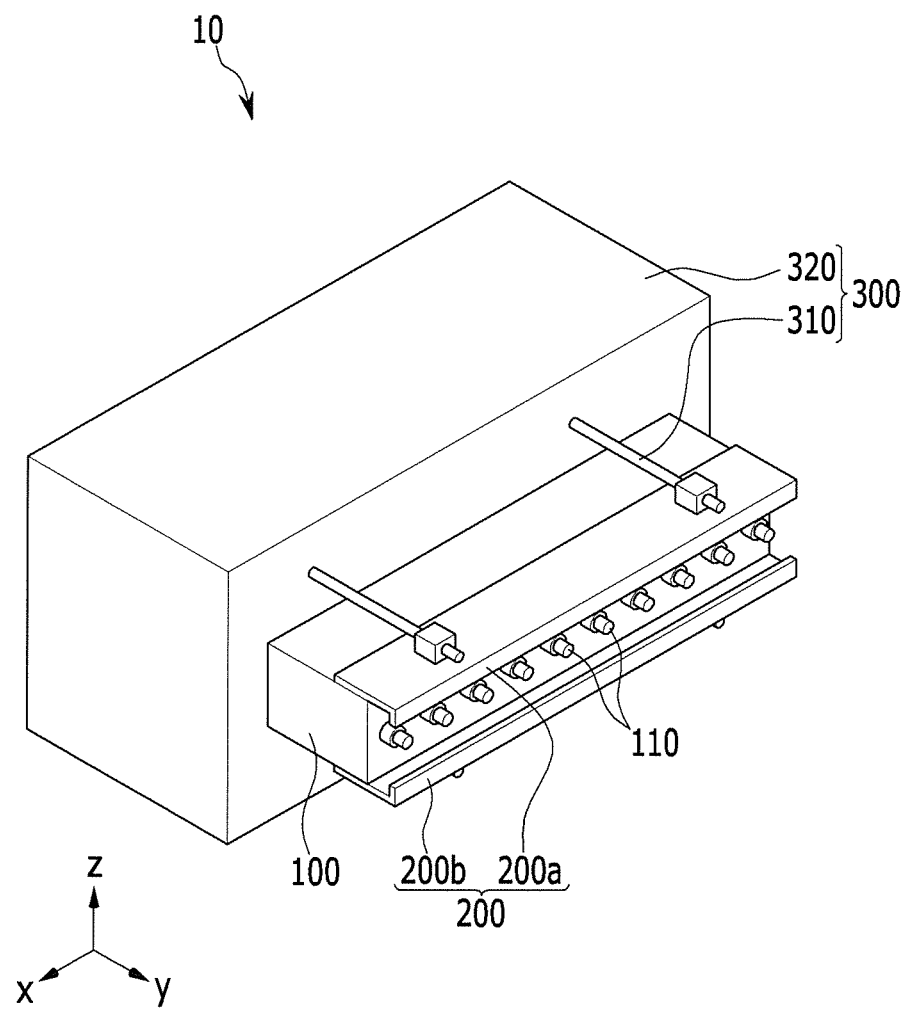
FIG. 1 shows a perspective view of a deposition device according to an exemplary embodiment of the present invention.

A deposition device and a method for manufacturing an OLED display according to embodiments of the present invention will be described with reference to accompanying drawings. However, the present invention is not limited to the disclosed exemplary embodiments, but may be implemented in various different forms. The exemplary embodiments herein complete the disclosure of the present invention and fully provide explanation of the invention to the ordinarily skilled person in the art. Like reference numerals refer to like elements.

In the drawings, the thickness of layers, films, panels, regions, areas, etc., may be exaggerated for clarity and for understanding and ease of description. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. Further, throughout the specification, "on" implies being positioned above or below a target element, and does not necessarily imply being positioned with respect to a direction of gravity.

Figure 2A:
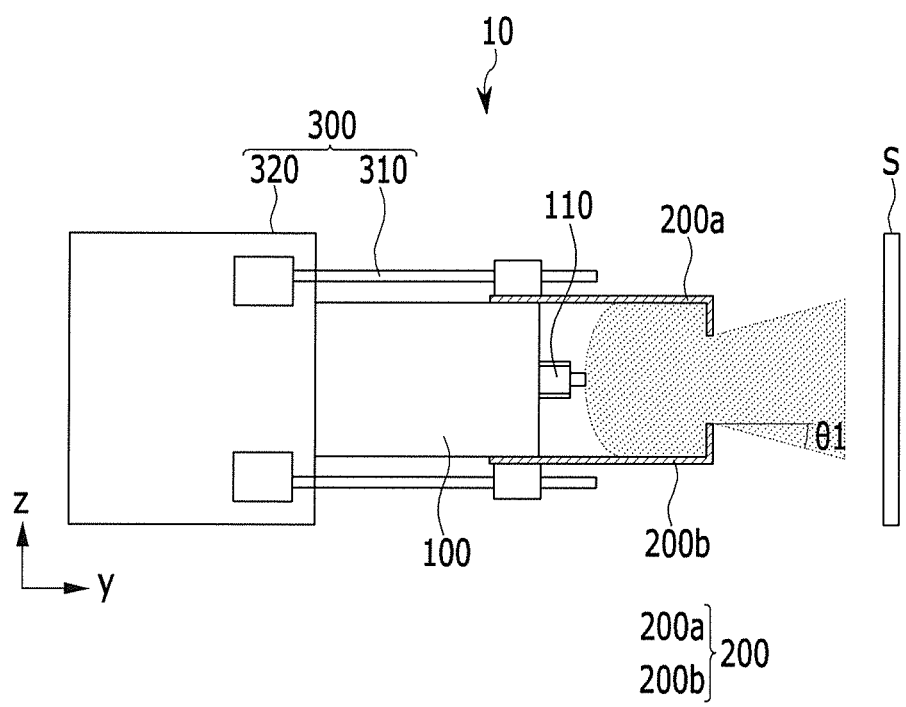
FIG. 2A to FIG. 2C show side views of a deposition device according to another exemplary embodiment of the present invention.
Figure 2B:
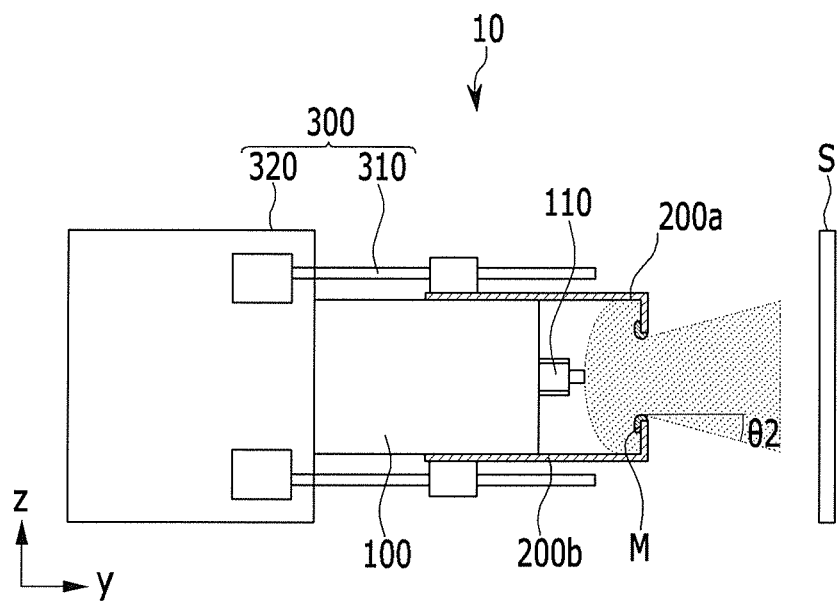
Figure 2C:
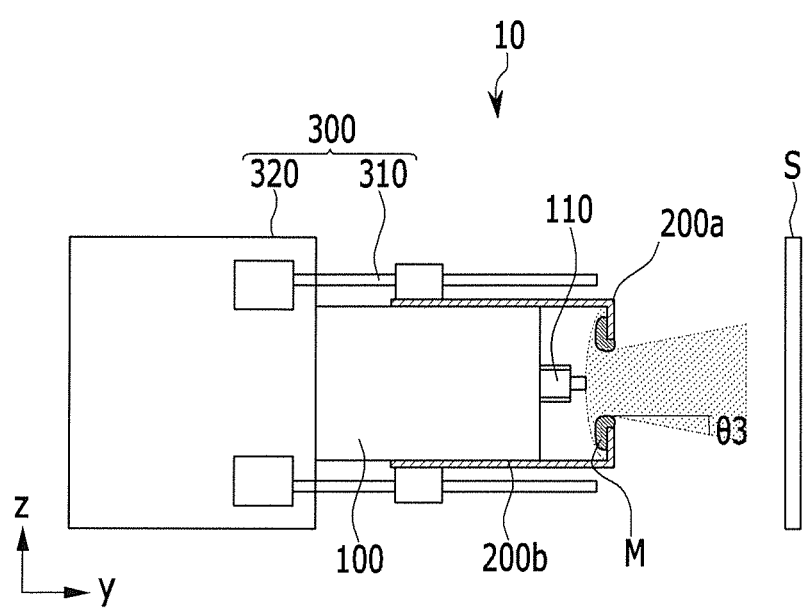

FIG. 1 shows a perspective view of a deposition device according to an exemplary embodiment of the present invention, and FIG. 2A to FIG. 2C show side views of a deposition device according to an exemplary embodiment of the present invention.

The deposition device 10 includes a deposition source 100, an angle control member 200, and an angle control member driver 300.

The vacuum chamber is not shown in the figures for better understanding and ease of description, and all components shown in FIG. 1 and FIG. 2 are located in the vacuum chamber. The deposition device 10 and a substrate (S) for forming a thin film are located in the vacuum chamber. The substrate (S) is arranged to face the deposition device 10. The substrate (S) can be deposited while moving relative to the deposition device 10. When the substrate (S) is arranged in a horizontal direction, the deposition device 10 may be separately located beneath the substrate (S) to discharge the deposition material, and when the substrate (S) is arranged in a vertical direction, the deposition device 10 can be separately located in a parallel direction with the substrate (S) (e.g., see FIGS. 2A-3B). In the present exemplary embodiment of the present invention, the deposition device 10 has been shown to be separately arranged in the parallel direction with the substrate (S), and for example, the substrate (S) can be separate from the deposition device 10 extending in a vertical direction.

The deposition source 100 may be used for discharging the deposition material and depositing the same on the substrate (S), and the deposition source 100 includes a space (not shown) for receiving the deposition material to be deposited, which may include an organic material, therein. The space for receiving the deposition material can be formed with a ceramic material such as, for example, alumina ($Al_2O_3$) or aluminum nitride (AlN) with excellent heat radiation, but is not limited thereto, and can also be formed with various materials having excellent heat radiation and thermal resistance. A heater (not shown) formed to be attached to and to surround an external side of the space for receiving the deposition material can be provided to heat and vaporize the received deposition material. A spray nozzle 110 for spraying the deposition material that is vaporized or sublimated in the inner space of the deposition source is located on one side of the deposition source 100 facing the substrate (S).

The substrate (S) on which the deposition material will be formed can be formed to be a quadrangle, and the deposition source can be configured to be a linear deposition source in which one or more spray nozzles 110 for discharging the deposition material may be linearly arranged on one side of the substrate (S). As shown in FIG. 1, spray nozzles 110 can be arranged in a line, and the spray nozzles 110 can also be disposed in multiple lines.

The angle control member 200 is on one side of the deposition source 100 and is in a discharging path of deposition material discharged from the spray nozzle(s) 110 of the deposition source 100 to control a discharging direction of the spray nozzle(s) 110 (e.g., a final direction of the discharged deposition material). When the deposition source 100 represents a linear deposition source as shown in FIG. 1, the angle control member 200 can be formed in a length direction of the linear deposition source, and located in the discharging path of the deposition material. For example, angle control members (200: 200a, 200b) are formed with two plate-type members respectively on one of two long sides of the linear deposition source (e.g., above and below the spray nozzle(s) 110). At least a part of each of the plate-type members is bent toward a direction of the spray nozzle 110, that is, to be in the discharging path of the deposition material to control the discharging direction of the deposition material (e.g., by blocking some of the discharged deposition material). The angle control member 200 is not limited to the form of the present exemplary embodiment, and the angle control member 200 is not limited to a specific form when it is disposed at least partly in the deposition material path and controls the direction of the deposition material discharged from the deposition source 100 to be deposited on the substrate (S).

As shown in FIG. 2A, the deposition material is sprayed through the angle control member 200 with a discharging angle (e.g., a predetermined discharging angle, or an angle of the deposition material discharged) $\theta 1$ and is then deposited on the substrate (S). The deposition material reaches the substrate (S) with a substantially constant angle so the deposition material is formed to be a substantially uniform thin film on the substrate (S). In this instance, the discharging angle $\theta 1$ represents an angle between a direction (e.g., horizontally-axis direction in FIG. 2A) of the deposition material discharging path and an outermost direction in which the deposition material is scattered and is actually spread (e.g., a fringe of the discharged deposition material).

The angle control member driver 300 is coupled to the angle control member 200 and controls the angle control member 200 to move forward and backward (e.g., in the horizontal/y-direction of FIG. 2A) in the deposition material discharging direction. Regarding the thin film forming process for depositing the deposition material on the substrate (S), the deposition material is deposited on many components in the vacuum chamber in addition to the substrate (S) when the process time (e.g., operation time) is passed (e.g., after extended use). Particularly, the deposition material is generally deposited on the components in the deposition material discharging path, such as the angle control member 200. As shown in FIG. 2B and FIG. 2C, when the deposition material is attached to be solidified on (e.g., builds up on) a part of the angle control member 200 in the deposition material discharging path, the discharging angle (e.g., $\theta 2$ or $\theta 3$) can be changed.

In this instance, when the solidified, attached deposition material (M) and the angle control member 200 are moved backwards or forwards to control the discharging angle (e.g., discharging angle $\theta 2$ of FIG. 2B or discharging angle $\theta 3$ of FIG. 2C), the deposition material can be discharged with the initial discharging angle (e.g., discharging angle $\theta 1$ of FIG. 2A) that is set before the attached material (M) is attached/builds up. That is, since the angle control member 200 moves backwards or forwards, the deposition material can be formed with a substantially constant discharging angle irrespective of the attached deposition material (M) attached to the angle control member 200 during the thin film forming process. A detailed description thereof will be described with reference to an operation of the deposition device and a method for forming a thin film according to an exemplary embodiment of the present invention.

The angle control member driver 300 includes a driver 310 for controlling the angle control member 200 to move backwards or forwards in the discharging direction of the deposition material, and a drive power provider 320 for providing drive power for moving the driver 310 backwards or forwards. A first side of the driver 310 is coupled to the angle control member 200, and a second side of the driver 310 is coupled to the drive power provider 320 to move the angle control member 200 backwards or forwards using the drive power generated by the drive power provider 320. The drive power provider 320 is coupled to one side of the deposition source 100 in the drawing, although the present invention is not limited thereto.

The angle control member driver 300 of the present embodiment can be selected from among devices that are available for linear movement such as, for example, a ball screw type, a cylinder type, or an linear movement (LM) guide type. For example, when the angle control member 200 adopts the cylinder type, the driver 310 is configured with a device available for linear (e.g., back and forth, or backward and forward) movement inclusive of a cylinder and a piston, and the drive power provider 320 can be configured with a hydraulic pump or a pneumatic pump. In the case of the ball screw type, the driver 310 is configured with a device available for linear movement, such as a ball screw bearing and a ball screw lead, and the drive power provider 320 can be configured with an electric motor for providing torque. Detailed configurations of these types of drivers are known to a person of ordinary skill in the art, who can change them in various ways. Also, the angle control member driver 300 is not limited to the above-described embodiments, and can be other devices for controlling the angle control member 200 to move backwards and forwards on a straight line.

As described above, the angle control member driver 300 moves backward or forward depending on a process time (e.g., an amount of process time elapsed), and it can further include a controller (not shown) for controlling the angle control member 200 to move backwards or forwards according to the process time. The controller measures the discharging angle of the deposition material by using a sensor in real time, and when the discharging angle is changed (e.g., due to the attached material (M) attached to the angle control member 200), the controller moves the angle control member 200 backward or forward to restore the discharging angle (e.g., to the discharging angle $\theta 1$ of FIG. 2A).

Also, the controller checks (e.g., through a simulation process) the amount of the deposition material that is attached to the angle control member 200 (e.g., attached material (M)), depending on the process conditions (including the process time, the deposition material, and the deposition material's discharging angle controlled according to the process time), and controls the discharging angle to maintain the original angle (e.g., the discharging angle $\theta 1$ of FIG. 2A) by moving the angle control member 100 backward or forward according to previously checked data.

Figure 3A:
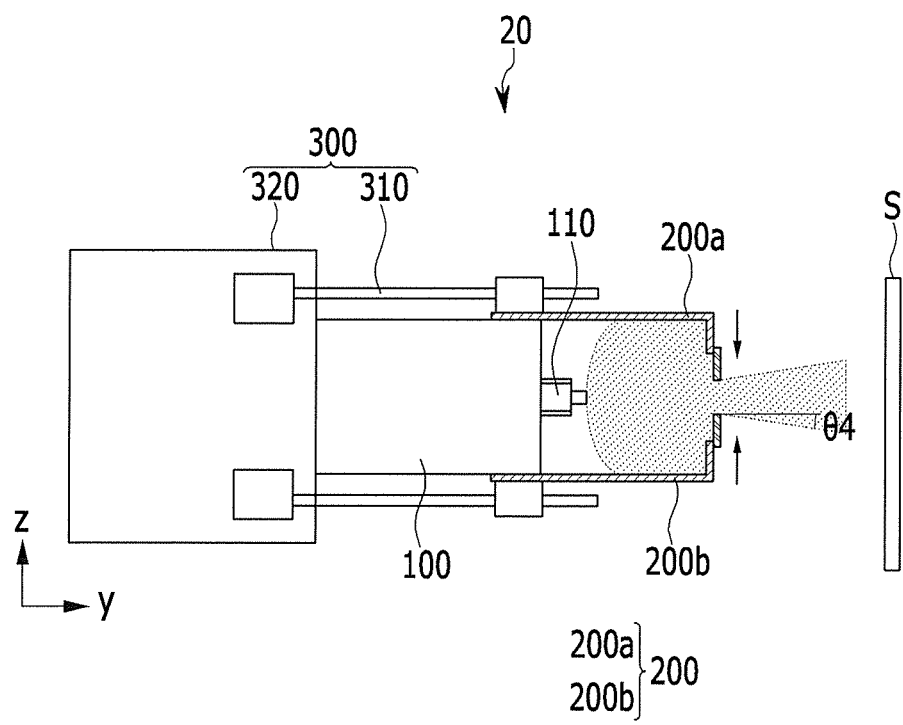
FIG. 3A and FIG. 3B show side views of a deposition device according to another exemplary embodiment of the present invention.
Figure 3B:
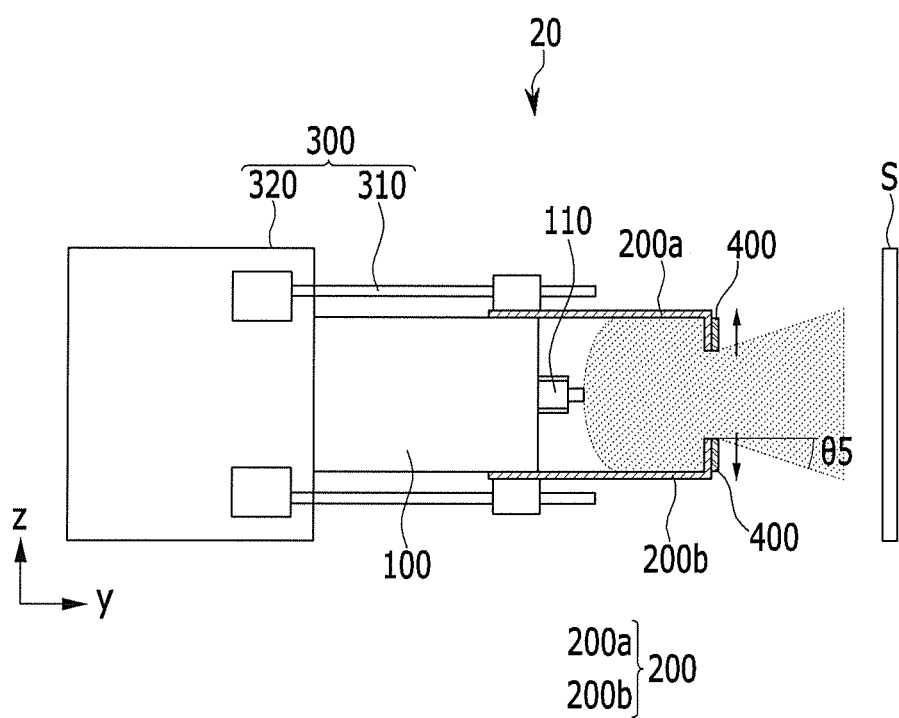
Figure 4A:
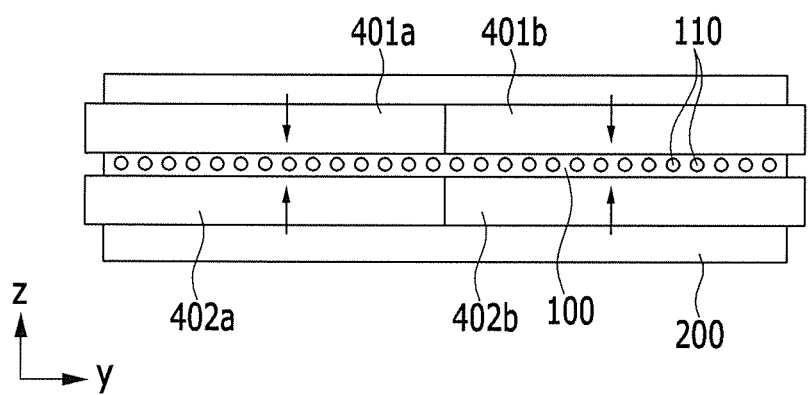
FIGS. 4A and 4B show front views of a deposition device according to another exemplary embodiment of the present invention.
Figure 4B:
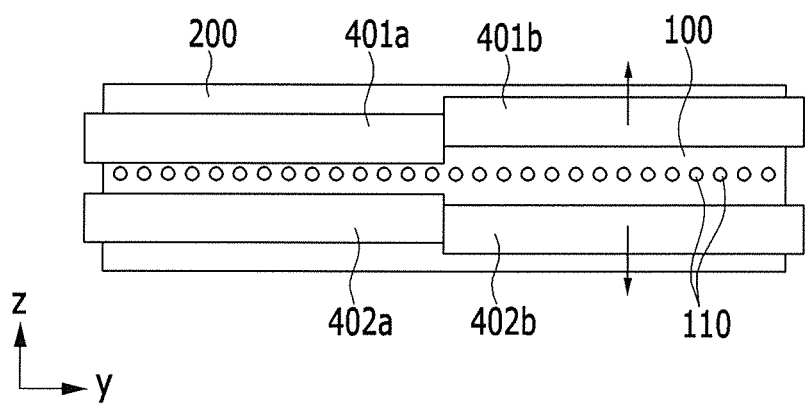

FIGS. 3A and 3B show side views of a deposition device 20 according to another exemplary embodiment of the present invention, and FIGS. 4A and 4B show front views of a deposition device 20 according to another exemplary embodiment of the present invention.

Referring to FIG. 3A and FIG. 3B, a pair of cover plates 400 can be coupled to first sides (e.g., front sides) of a pair of angle control members 200*a* and 200*b*, and can be located in the discharging path of the deposition material. The cover plates 400 may be driven in a direction (e.g., in the vertical direction, or the z-axis direction, shown in FIGS. 3A-4B) crossing the deposition material's discharging direction, and may be used to control a size of a gap between the pair of angle control members 200*a* and 200*b* (e.g., between the cover plates 400). For example, a pair of cover plates 400 are plate-shaped and are located on first sides of a pair of angle control members 200*a* and 200*b*, and as shown in FIG. 3A and FIG. 3B, each of the cover plates 400 is physically coupled to bent parts of the angle control members 200*a* and 200*b* (e.g., vertical parts of the angle control members 200*a* and 200*b*, or parts extending substantially in the z-axis direction), wherein at least a part of the angle control members 200*a* and 200*b* is bent toward the discharging path, thereby enabling control of the discharge angle (e.g., the discharging angle $\theta 4$ of FIG. 3A or the discharging angle $\theta 5$ of FIG. 3B) formed due to the angle control members 200*a* and 200*b*.

As shown in FIG. 3A, it is possible to reduce a discharging angle (e.g., the discharging angle $\theta 4$) of the deposition material by moving the pair of cover plates 400 to be closer to each other to reduce the gap between the pair of angle control members 200*a* and 200*b* (e.g., the gap between the cover plates 400). As shown in FIG. 3B, it is possible to increase the discharging angle (e.g., the discharging angle $\theta 5$) of the deposition material by moving the pair of cover plates 400 to be further from each other to increase the gap. By controlling the cover plates 400, it is possible to further control the discharging angle of the deposition material without moving the angle control member 200 backwards or forwards, or to control the discharging angle in a manner that cannot be done by backward or forward movement of the angle control member 200. The cover plates 400 can be moved with respect to the angle control member 200 in linkage with the angle control member 200 (e.g., corresponding to a position of the angel control member 200).

The cover plate 400 can be separated into multiple plates in the length direction of the deposition source 100 formed in a linear manner (e.g., the cover plate 400 may have a length corresponding to length of the deposition source 100, or the number of spray nozzles 110). For example, as shown in FIG. 4A and FIG. 4B, a pair of cover plates 401 and 402 that are formed on a pair of angle control members 200a and 200b can be divided into two pairs of cover plates (401: 401a, 401b/ 402: 402a, 402b) in the length direction of the deposition source 100, wherein the divided cover plates (401a, 401b, 402a, 402b) are independently operable.

Referring to FIG. 4B, the pair of cover plates 401a and 402a move closer to each other to reduce a corresponding discharging angle, and the pair of cover plates 401b and 402b move farther from each other to increase the discharging angle of the deposition material. Further, the pair of cover plates 401a and 402a can be independently operable (e.g., operated independently of each other and of cover plates 401b and 402b).

An operation of a deposition device and a method for manufacturing an OLED display according to an exemplary embodiment of the present invention will now be described.

First, a substrate (S) is placed in a vacuum chamber (not shown), and oriented to face the deposition source 100 discharging the deposition material. The deposition material of the deposition source 100 is heated to be vaporized, and as shown in FIG. 2A, the deposition material is discharged through the spray nozzle(s) 110. The discharged deposition material reaches the substrate (S) to form a thin film thereon. The discharged deposition material is discharged (e.g., constantly discharged) with a discharging angle (e.g., a constant predetermined discharging angle) $\theta 1$ corresponding to control of the angle control member 200.

While the deposition material is discharged on the substrate (S) to form a thin film, the deposition material is deposited on the substrate (S) and also on the angle control member 200 in the discharge path of the deposition material. As shown in FIG. 2B, when some of the deposition material is deposited on a part of the angle control member 200 and then solidified (e.g., deposition material (M)), the discharging angle $\theta 2$ can be changed. The discharging angle $\theta 2$ may be reduced by the deposition material (M) attached to the angle control member 200, and when the angle control member driver 300 causes the angle control member 200 to move backward to reduce the distance between the angle control member 200 and the spray nozzle 110, the discharging angle $\theta 2$ is increased. The discharging angle $\theta 2$ may be controlled to be equivalent to the discharging angle $\theta 1$ of the earlier stage of the process by increasing the discharging angle $\theta 2$ reduced by the attached material (M).

As the thin film forming process progresses (e.g., as process time increases), as shown in FIG. 2C, the attached deposition material (M) further builds up on the angle control member 200, and the discharging angle $\theta 3$ of the deposition material is further reduced. In this instance, when the angle control member driver 300 causes the angle control member 200 to move farther back, the distance between the angle control member 200 and the spray nozzle 110 is further reduced, and the discharging angle $\theta 3$ is increased so that the discharging angle $\theta 3$ may be equivalent to the discharging angle $\theta 1$ of the earlier stage of the process, thereby compensating for the buildup of the deposition material (M).

As described, when the discharging angle of the deposition material is changed by the deposition material (M) attached to the angle control member 200 during the thin film forming process, the angle control member 200 is controlled to move backward as the process time is passed so that the discharging angle is maintained to be constant (e.g., $\theta 1=\theta 2=\theta 3$). Therefore, a substantially uniform thin film is deposited on the substrate (S).

In addition, the process time, the amount of the deposition material (M) attached to the angle control member 200, and the control of the discharging angle of the deposition material corresponding to the amount of process time (e.g., the number of minutes since a most recent maintenance of the manufacturing equipment) can be checked through the simulation process, and the angle control member 200 can be automatically and regularly adjusted according to the process time through the checked information.

For example, when the deposition material is deposited on the substrate (S) to form the thin film, it is checked whether the discharging angle is reduced because of the deposition material (M) attached to the angle control member 200 each time a unit of the process time passes, the angle control member 200 is controlled to move backward by a unit of length according to the process time elapsed to improve the thin film forming process.

The deposition material desirably includes an organic material for forming an organic emission layer, that is, for forming subpixels for displaying red (R), green (G), and blue (B) in the OLED display.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and their equivalents.

What is claimed is:

1. A deposition device comprising:
   a deposition source for discharging a deposition material to be deposited on a substrate;
   an angle control member at least partly in a discharging path of the deposition material for controlling a discharging angle of the deposition material by increasing or decreasing an area of the discharging path; and
   an angle control member driver coupled to the angle control member, the angle control member driver for moving the angle control member in a discharging direction of the deposition material to control the discharging angle.

2. The deposition device of claim 1, wherein the angle control member driver comprises a ball screw drive, a cylinder drive, or a linear motion guide drive.

3. The deposition device of claim 1, further comprising a controller for controlling the angle control member driver to move the angle control member according to a process condition.

4. A deposition device comprising:
   a deposition source for discharging a deposition material to be deposited on a substrate and comprising a spray nozzle for discharging the deposition material, and
   an angle control member at least partly in a discharging path of the deposition material for controlling a discharging angle of the deposition material and comprising a pair of angle control members each located on a long side of the deposition source and extending in a length direction of the deposition source; and
   an angle control member driver coupled to the angle control member, the angle control member driver for moving the angle control member in a discharging direction of the deposition material to control the discharging angle.

5. The deposition device of claim 4, further comprising a pair of cover plates each on a side of a respective one of the pair of angle control members,
 wherein the pair of cover plates are configured to move in a direction crossing the discharging direction to control a gap between the pair of cover plates.

6. The deposition device of claim 5, wherein a movement of the cover plate corresponds to a movement of the angle control member.

7. The deposition device of claim 5, wherein the pair of cover plates comprises at least two pairs of cover plates adjacent one another in the length direction of the deposition source.

8. The deposition device of claim 7, wherein each of the cover plates of the at least two pairs of cover plates is independently operable.

9. A method for manufacturing an organic light emitting diode display, the method comprising:
 facing a substrate toward a deposition source for discharging a deposition material; and
 forming a thin film on the substrate by discharging the deposition material on the substrate,
 wherein the forming of the thin film on the substrate comprises controlling a discharging angle of the deposition material by moving an angle control member with respect to the deposition source to increase or decrease a discharging area of the deposition material, the angle control member being partly in the discharging path of the deposition material.

10. The method of claim 9, wherein the moving the angle control member comprises moving the angle control member toward the deposition source at a rate corresponding to an amount of process time passed.

11. The method of claim 9, wherein the deposition material comprises an organic material for forming an organic emission layer, and
 wherein the thin film comprises the organic emission layer.

* * * * *